United States Patent
Webb et al.

(10) Patent No.: US 9,300,267 B2
(45) Date of Patent: Mar. 29, 2016

(54) DIGITAL GAIN CONTROL DEVICE AND METHOD FOR CONTROLLING AN ANALOG AMPLIFIER WITH A DIGITAL PROCESSOR TO PREVENT CLIPPING

(71) Applicants: Reginald Webb, Chandler, AZ (US); Laurie Webb, Chandler, AZ (US)

(72) Inventors: Reginald Webb, Chandler, AZ (US); Laurie Webb, Chandler, AZ (US)

( * ) Notice: Subject to any disclaimer, the term of this patent is extended or adjusted under 35 U.S.C. 154(b) by 314 days.

(21) Appl. No.: 13/842,428

(22) Filed: Mar. 15, 2013

(65) Prior Publication Data

US 2014/0270255 A1 Sep. 18, 2014

(51) Int. Cl.
*H03G 7/00* (2006.01)

(52) U.S. Cl.
CPC ............... *H03G 7/007* (2013.01); *H03G 7/002* (2013.01)

(58) Field of Classification Search
None
See application file for complete search history.

(56) References Cited

U.S. PATENT DOCUMENTS

| | | | | |
|---|---|---|---|---|
| 5,677,962 | A * | 10/1997 | Harrison et al. | 381/109 |
| 5,821,889 | A * | 10/1998 | Miller | 341/139 |
| 8,275,152 | B2 * | 9/2012 | Smirnov et al. | 381/98 |
| 2005/0184891 | A1 * | 8/2005 | Nakagaki et al. | 341/110 |
| 2007/0140513 | A1 * | 6/2007 | Furge | 381/120 |
| 2010/0266142 | A1 * | 10/2010 | Huijnen et al. | 381/102 |
| 2012/0201400 | A1 * | 8/2012 | Ayres | 381/107 |
| 2012/0294459 | A1 * | 11/2012 | Chapman et al. | 381/98 |
| 2014/0080549 | A1 * | 3/2014 | Li et al. | 455/571 |
| 2014/0254807 | A1 * | 9/2014 | Fonseca et al. | 381/56 |

FOREIGN PATENT DOCUMENTS

CN 102118135 * 7/2011 ............... H03G 3/20

OTHER PUBLICATIONS

Chen et al. Translation of CN102118135. pp. 1-17. Published Jul. 6, 2011.*

* cited by examiner

*Primary Examiner* — Curtis Kuntz
*Assistant Examiner* — Qin Zhu
(74) *Attorney, Agent, or Firm* — Robert D. Atkins; Patent Law Group: Atkins and Associates, P.C.

(57) ABSTRACT

An amplifier including a first gain level is provided. An analog input is provided to the amplifier. An analog output from the amplifier is converted to a digital output. The digital output is analyzed to detect a level of the analog output exceeding a threshold. A second gain level of the amplifier is set lower than the first gain level. An interface is provided to adjust the threshold. A signature of the analog output is identified. A library comprising a plurality of signatures is provided including the signature of the analog output. The signature of the analog output is compared to the plurality of signatures to determine when to reset the first gain level of the amplifier. The level of the digital signal is monitored to determine when to reset the first gain level of the amplifier. The first and second gain levels are set using a digital signal processor.

18 Claims, 6 Drawing Sheets

DIGITAL GAIN CONTROL DEVICE AND METHOD FOR CONTROLLING AN ANALOG AMPLIFIER WITH A DIGITAL PROCESSOR TO PREVENT CLIPPING

FIELD OF THE INVENTION

The present invention relates in general to amplification systems and, more particularly, to a system and method for controlling an analog amplifier using a digital processor to prevent clipping.

BACKGROUND OF THE INVENTION

The entertainment industry has become a ubiquitous part of modern society. Movie and television studios commonly spend millions of dollars to produce movies and television shows that the public spends billions of dollars each year to consume. People rely on movie and television media to provide entertainment, but also as a source of current events, popular culture, and even education.

Over time, technology enabling production of movies and television shows has improved dramatically, allowing the entertainment industry to sustain the public's demand for new media. Today, entertainment media can be delivered to consumers through a wide variety of mediums including cable and satellite receivers, personal computers, or mobile devices in electronic communication with wireless data networks. In addition, video and audio can be recorded and delivered to consumers in extremely high definition and with extremely high clarity.

In order to ensure the highest possible quality final product, audio is recorded with an eye toward producing an audio recording that faithfully represents the recorded sounds. One problem that can reduce audio fidelity is clipping. Clipping is a form of distortion that limits a signal once the signal reaches a threshold, such as the maximum power output of an amplifier. In the case of audio-signal processing, clipping occurs when an amplifier becomes saturated due to a combination of high gain and loud sound. The peaks of the audio waveform are clipped because the amplifier lacks the capacity to accurately amplify the loud sound and the recording becomes less accurate.

In most cases, the device that operates to record high quality video is not the same device that is used to record high quality audio. In other words, for sophisticated movie and television productions, the audio is commonly recorded as a separate data signal from the video. After all, even if an audio recording device were physically attached to or integrated within a camera, on a typical movie or television set the camera operator often cannot position the camera in the ideal location to record dialogue or surrounding sounds while simultaneously filming the environment from the appropriate angle or distance. Furthermore, audio and video are typically recorded from many different perspectives and sources. For example, microphones are often physically attached to each of the actors and also positioned nearby, while cameras are positioned at various distances and angles to capture close-ups of the actors as well as the surrounding environment. Every amplified signal runs a risk of clipping, whether the signal originates with a camera, microphone, musical instrument, or other input device.

Because of the complexity of recording high quality audio and video, in many cases, movie and television productions employ entirely separate crews to record audio and video. The audio and video crews are then supervised and coordinated by various members of the production crew such as directors, script supervisors, or producers. Audio and video are then edited and combined by editors during the post-production process. The process can involve multiple amplification steps. Audio or video artifacts caused along the way because of clipping in various amplification stages are difficult or impossible to repair during post-production. The quality of the end product is increased by maintaining audio signals without introducing losses such as losses resulting from clipping during amplification.

Furthermore, the highest quality signal is usually the original analog signal. To ensure the highest quality product, the sound production crew wants to maintain an analog signal for as long as possible and prevent clipping in the signal. One way to limit clipping is to manually adjust the gain as the signal changes. However, manually adjusting gain is slow and a significant portion of the signal will clip before a human can detect clipping and reduce the gain. Furthermore, maintaining a high fidelity analog signal is difficult, as many signal-processing steps are carried out on digital signals requiring that the analog signal be converted to a corresponding digital signal.

SUMMARY OF THE INVENTION

A need exists to provide a device to prevent amplifier clipping and maintain a high quality analog signal. Accordingly, in one embodiment, the present invention is a method of monitoring an audio signal comprising providing an amplifier including a first gain level, providing an analog input to the amplifier, converting an analog output from the amplifier to a digital output, analyzing the digital output to detect a level of the analog output exceeding a threshold, and setting a second gain level of the amplifier lower than the first gain level.

In another embodiment, the present invention is a method of monitoring an audio signal comprising providing an amplifier including a first gain level, providing an input to the amplifier, detecting a level of an output of the amplifier exceeding a threshold, and setting a second gain level of the amplifier lower than the first gain level.

In another embodiment, the present invention is a method of monitoring an audio signal comprising providing an amplifier including a gain level, detecting a level of an output of the amplifier that exceeds a threshold, and reducing the gain level of the amplifier.

In another embodiment, the present invention is a gain-control device comprising an amplifier including a gain. An analog-to-digital converter converts an analog output of the amplifier to a digital output. A digital signal processor analyzes the digital output and controls the gain of the amplifier.

DETAILED DESCRIPTION OF THE DRAWINGS

Figure 1:
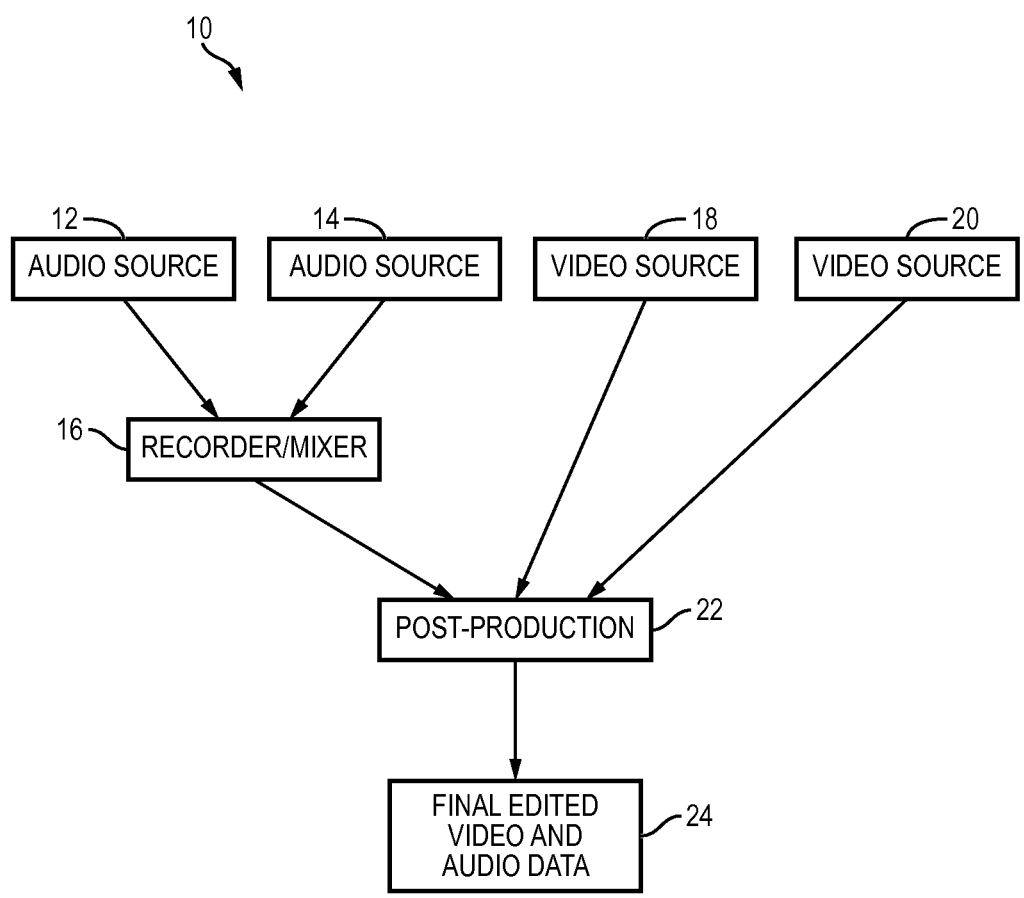
FIG. 1 illustrates a scenario for production and post-production of audio and video recordings.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Since the early days of silent films, where movies were filmed using hand-cranked cameras and lacked any synchronized sound or dialogue, the technology supporting the entertainment industry has evolved significantly. Today, even amateur film makers can produce high definition video and audio recordings using camera systems incorporated into hand-held cellular telephones. Professional television and movie producers, meanwhile, often spend millions of dollars on individual productions in order to produce high quality video and audio using state-of-the-art technology.

A typical movie or television production has a large team of crew members, from producers, directors, script supervisors, set designers, costume designers, camera operators, audio crew members, and many others. A well-run production requires constant communication between members of the production crew in order to ensure recording of video and audio runs smoothly, without having to re-shoot scenes. Coordinating communication between members of the production crew often involves the use of intercoms and transmission of vocal communications to headsets or earpieces worn by the crew members. In addition, certain members of the production crew monitor audio and video feeds during shoots in order to ensure that audio and video are captured according to the mandates of the script and the artistic vision of the director. One of the tasks of the sound crew is to monitor the audio received from microphones around the set, including microphones in transmitters attached to the cast.

A cast might include 8 members each having their own microphone. The sound production crew tries to amplify the sounds being captured by the microphones as much as possible without introducing clipping to the recording. Higher levels are desired because recording mediums can introduce noise. Recordings with high amplitudes produce the least noisy recording. As a result, the sound crew has to attempt to prevent clipping in each of the microphone transmitters before the sound ever reaches a mixer. The amplification level of each of the microphones can be calibrated to human speech, so that the gain amplifies sounds with volume similar to human speech to the desired level. A certain amount of headroom is allowed so elevated voices can be adequately captured. However, if a train sounds a horn, a dog barks, or another relatively loud sound is picked up in the microphone then the amplifier on the transmitter may not be able to amplify the loud sound given the gain settings. The result is clipping. Furthermore, sudden loud sounds can result in extremely high volumes being reproduced in the headphones of the audio crew.

To prevent clipping, the sound crew can adjust the amplifier by reducing the gain. The lower gain level allows more headroom in decibels above human speech to accommodate a bellowing train whistle or a sudden dog bark. However, the lower gain level also results in the desired sounds being amplified to lower levels than desired so that the source sound is less distinguished from noise. Sometimes, an automatic gain control (AGC) is employed. One problem with traditional AGCs is that the loud sounds can be reproduced as quiet while the soft sounds can be reproduced as louder than intended, resulting in a compressed dynamic range.

In addition, the practicalities of movie and television production typically require separate teams to record audio and video. Audio and video are typically recorded as separate data signals in order to capture the highest quality audio and video. During post-production and editing, the audio and video are then synchronized and re-combined into a single production. Despite the evolution of technology to support the entertainment industry, there is still no way to recreate audio data lost by a clipping amplifier.

For example, FIG. 1 illustrates a scenario for production and post-production of audio and video recordings. A production or film is recorded in the field or on film set 10. Film set 10 includes a plurality of audio sources 12 and 14. Audio sources 12 and 14 include microphones attached to actors, subjects of a documentary, interviewers and interviewees, or other people providing dialogue. Alternatively, audio sources 12 and 14 include computer generated sounds or microphones capturing sound effects in the natural environment. Audio sources 12 and 14 are capable of capturing sounds and converting the sounds into electronic signals or audio signals. Audio sources 12 and 14 are electrically connected to recorder/mixer 16, which captures the audio signals from audio sources 12 and 14 and records the audio signals in a fixed medium such as a magnetic tape, hard drive, flash memory, or other mass storage device. In addition, recorder/mixer 16 is capable of adjusting the characteristics of the audio signals from audio sources 12 and 14 and mixing the audio signal into a single mixed audio signal.

In addition, film set 10 includes a plurality of video sources 18 and 20, which may include analog or digital video cameras capable of recording various actors, subjects, or environments. After audio sources 12 and 14, recorder/mixer 16, and video sources 18 and 20 record audio and video during the production process, the audio signals from recorder/mixer 16, and the video from video sources 18 and 20 are edited in post-production process 22. In post-production process 22, various editors, directors, and producers edit and adjust the audio and video according to the script and artistic vision of the post-production team. During post-production process 22, video and audio recorded during production is rearranged or deleted, and additional supplemental audio and video may be added before the final edited video and audio data 24 is released for public consumption.

Figure 2:
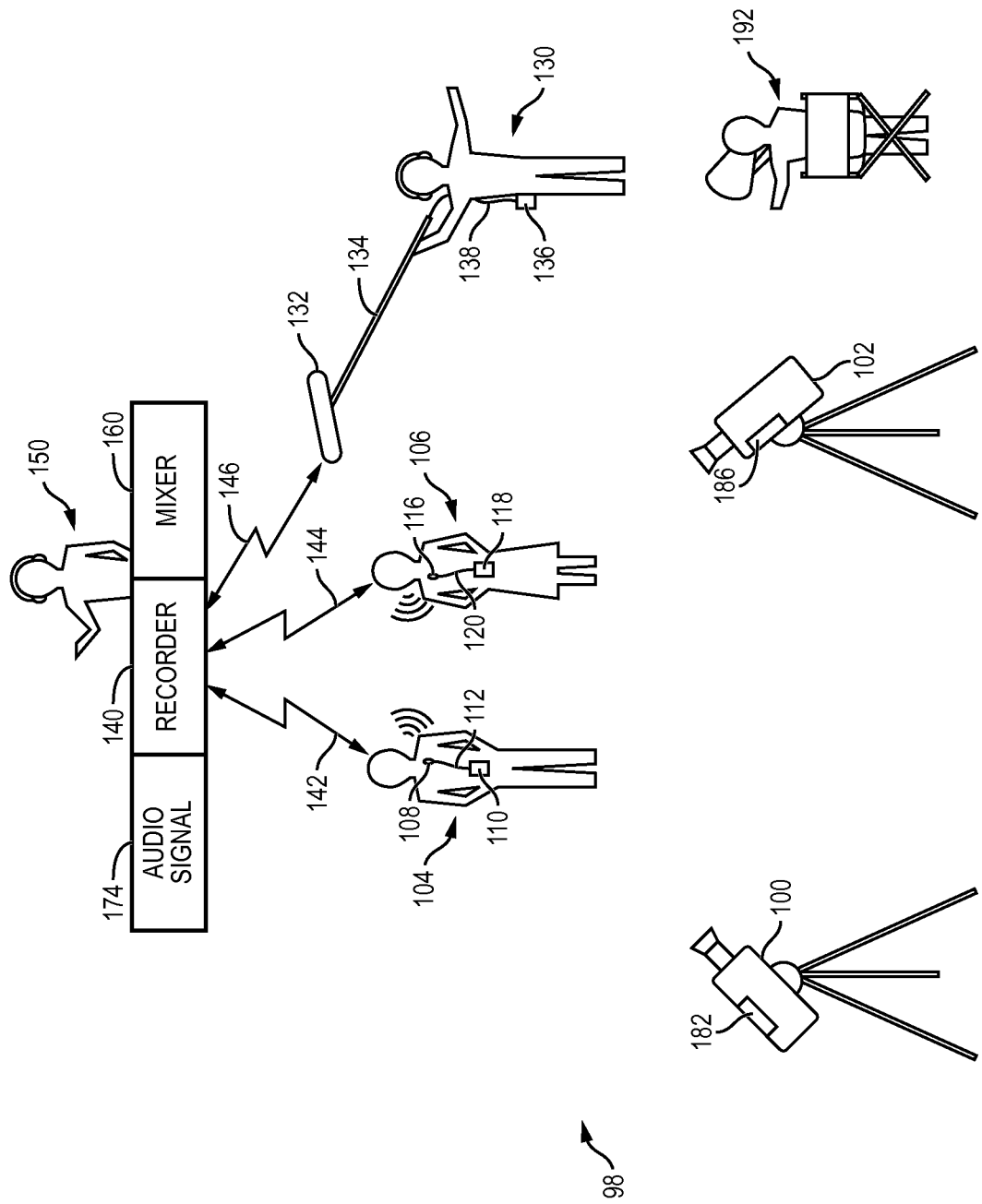
FIG. 2 illustrates a production set including microphones, cameras, and a recorder.

FIG. 2 illustrates a production or film set 98 including microphones, cameras, and a recorder. Film set 98 includes video cameras 100 and 102 and talent 104 and 106. Film set 98 can be the scene of a movie or television production, a documentary film, a theater production, a reality television program, or on location in the field of a news report or in nature. Video camera 100 and video camera 102 record video of talent 104 and 106 engaging in a conversation. Talent 104 and 106 can be actors on a movie or television set, reading lines from a script. Alternatively, talent 104 and 106 may be the subjects of a documentary film, live event, or a reality television program.

A microphone 108 is attached to the clothing or body of talent 104. Microphone 108 is in electronic communication with transmitter 110 by way of wire 112. Transmitter 110 includes an internal battery as a power supply and is capable of wirelessly transmitting audio received through microphone 108 to a nearby receiver or recorder unit. Similarly, a microphone 116 is attached to the clothing or body of talent 106. Microphone 116 is in electronic communication with transmitter 118 by way of wire 120. Transmitter 118 includes an internal battery as a power supply and is capable of transmitting audio received through microphone 116 to a nearby receiver or recorder unit. Audio received through microphones 108 and 116 must be amplified from mic level to a level sufficient for wireless transmission before transmitters 110 and 118 send wireless audio data. The audio signal is susceptible to clipping prior to the wireless transmission during the initial amplification stage. An intelligent clip elimination device is integrated into the transceiver 110 and 118 or microphone 108 and 116 to prevent clipping during the initial amplification of the audio signal.

In addition, boom operator 130 operates boom microphone 132 from a position out of view of cameras 100 and 102. Boom microphone 132 is supported by boom pole 134, which is held by boom operator 130. Boom microphone 132 is capable of receiving audio from the environment surrounding talent 104 and 106 and the voices of talent 104 and 106. Boom operator 130 is mobile and is able to move boom microphone 132 to the appropriate position to record the appropriate interaction according to the script or the interaction between talent 104 and 106. Boom operator 130 carries transmitter 136, which is electrically connected to microphone 132 by way of wire 138. Transmitter 136 includes an internal battery as a power supply and is capable of wirelessly transmitting audio received through microphone 132 to a nearby receiver or recorder unit. Audio received through boom microphone 132 must be amplified from mic level to a level sufficient for wireless transmission before transmitter 136 sends wireless audio data. The audio signal is susceptible to clipping prior to the wireless transmission, during the initial amplification stage. An intelligent clip elimination device is integrated into transmitter 136 and microphone 132 system to prevent clipping during the initial amplification of the audio signal. Alternatively, microphone 132 can be connected to a receiver or recorder unit by wire with initial amplification of the mic signal at the receiver or recorder. Intelligent clip elimination device can be deployed in the recorder or mixer during signal amplification to limit clipping.

Transmitters 110, 118, and 136 are in electronic communication with recorder 140 by way of communication channels 142, 144, and 146, respectively. Communication channels 142, 144, and 146 are unidirectional or bi-directional and transmit data between recorder 140 and transmitters 110, 118, and 136 in a wireless configuration. As talent 104 and 106 interact and engage with one another, microphones 108, 116, and 132 receive the audio of the surrounding environment and voices of talent 104 and 106, respectively. Transmitters 110, 118, and 136 transmit the audio received by microphones 108, 116, and 132 after amplification with intelligent clip elimination to recorder 140.

Each of the audio data signals transmitted through communication channels 142, 144, and 146 operate as separate audio channels for subsequent audio mixing. Recorder 140 is an analog or digital recording device, capable of storing the audio signals received from microphones 108, 116, and 132 in a fixed medium such as a magnetic tape, vinyl record, hard drive, flash memory, or other similar mass storage device capable of storing analog or digital data. Recorder 140 is operated by sound mixer 150. Sound mixer 150 is responsible for ensuring that the appropriate sound is recorded from the environment surrounding talent 104 and 106 and making sure that all appropriate dialogue is received from microphones 108 and 116. In addition, sound mixer 150 communicates with boom operator 130 to ensure that boom operator 130 places boom microphone 132 in the appropriate location to capture any necessary audio. Intelligent clip elimination devices are integrated at each amplification stage to prevent clipping of the analog audio signal.

Sound mixer 150 may also be responsible for operating audio mixer 160 and mixing the audio signals recorded by recorder 140 or produced by various inputs at live events, for example. Alternatively, separate individuals may be responsible for mixing and recording the audio signals. Audio mixer 160 is in electronic communication with recorder 140, and in some instances, audio mixer 160 and recorder 140 are combined into a single unit or housing. Audio mixer 160 is capable of receiving the separate audio channels recorded by recorder 140 and combining or mixing the separate audio channels into a single audio signal. The terms audio signal and audio channel are used interchangeably to refer to audio data from a single audio source. Audio mixer 160 is also capable of adjusting various aspects of the separate audio channels during the mixing process, including routing the audio channels to other external devices, or changing the level, timbre, or other dynamics of the separate audio channels. In addition to adjusting the various aspects of the audio signals, audio mixer 160 mixes the analog or digital audio signals from the separate audio channels by summing the voltages or digital signals into a single monaural, stereo, or multi-channel audio signal. Audio mixer 160 also determines headroom values for each of microphone 108, 116, and 132 and adjusts the parameters of the intelligent gain control device.

Cameras 100 and 102 can also include an integrated microphone to record sounds along with video. Wireless transmitters 182 and 186 are integrated into cameras 182 and 186. Prior to transmitting or recording audio data recorded by cameras 182 or 186 with integrated microphones, the audio received through microphone must be amplified from mic level to a line level sufficient for wireless transmission or audio recording. The audio signal is susceptible to clipping prior to the wireless transmission or recording during the initial amplification stage. An intelligent clip elimination device is integrated into cameras 182 and 186 to prevent clipping during the initial amplification of the audio signal.

Figure 3A:
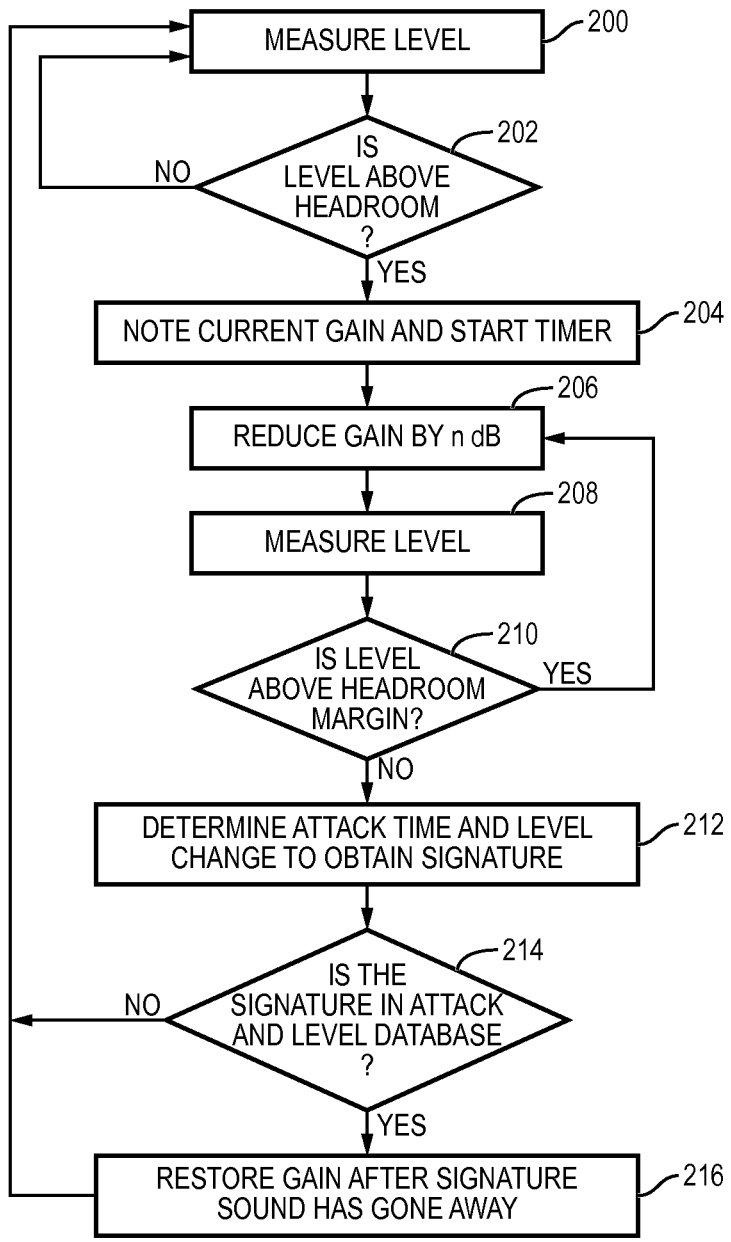
FIGS. 3a-3b illustrate process flow charts for identifying signals that may cause clipping and adjusting gain.

FIG. 3a illustrates a flowchart for an intelligent clip elimination system. The clipping elimination system measures signal levels from an amplifier in block 200. The system determines whether the signal level is above a predetermined headroom in block 202. The headroom is determined by comparing the signal level from the amplifier to the maximum signal level for the amplifier. The difference between the maximum value for the amplifier and the current value measured at the input or output represents the headroom. The desired headroom can be preset on the clip elimination device, provided by a user, or variable based on fluctuations in output levels. For example, if the signal level at a certain time is 10 decibels (dB) and the maximum level for the amplifier, or the saturation threshold, is 25 dB then the amplifier has 15 dB of headroom. If the output headroom is set to 5 dB, and the amplifier has a maximum output of 50 dB, then any signal level above 45 dB exceeds the prescribed headroom. For example, the signal level is 50 dB with a prescribed headroom of 5 dB and the amplifier has a maximum signal level of 50 dB. The signal level exceeds the headroom by 5 dB and the gain level of the amplifier must be reduced to reduce the signal level below 45 dB and allow for 5 dB of headroom.

If the signal level does not exceed the prescribed headroom in block 202, then the system continues to measure the monitored signal level at block 200. If the signal level exceeds the maximum power of the amplifier less the headroom, the system reacts to the signal exceeding headroom as a potential clipping event. The current gain is saved for future use once the potential clipping event is detected, in block 204. A timer is also started in block 204. The timer tracks the duration of the clipping event in block 204. The time measurements from the timer can be saved in conjunction with the level measured in block 200 to calculate the attack, delay, sustain, or other time-based characteristics and formulate a time-based signature including the signal level. For example, a signal takes 2 seconds to reach peak amplitude of 70 dB. The level and attack signature would be identified by the 2 second attack and the ultimate level of 70 dB. The time can also be saved with frequency-based characteristics such as harmonics or timbre of a sound to produce a sound signature based on frequency characteristics over time. For example, a human scream might have a basic frequency of approximately 400 hertz (Hz) and resultant harmonics at 800 Hz, 1200 Hz, 1600 Hz, 2000 Hz, and so on. The level of the basic frequency and harmonics can be included to form a frequency-domain signature of the audio signal. The signal processor monitoring the line level can also monitor the frequency domain and identify sounds likely to cause clipping and reduce the gain before clipping occurs. In block 206, the system reduces the gain of the amplifier by a predetermined dB level. The gain reduction can be input by a user, preset for the device, or variable as an amount of gain to reduce the output level within the headroom.

After the gain is reduced, the system measures the level of the signal again in block 208. If the measurement is high enough that the reduced gain still exceeds the headroom, the gain is further reduced by a predetermined dB level in block 210. The signal level is measured and reduced until the level is within the desired headroom in blocks 206-210. When the measurement from block 208 is not above the desired headroom, the system determines the attack characteristics and levels, for example, to determine a signature of the sound causing the amplifier to clip at the original gain level in block 212. The system can also keep a window of past time domain signal waves to provide information regarding the attack of a sound prior to the levels reaching an amplitude sufficient to cause clipping at the original gain levels.

Once the system has determined a signature for the signal being monitored in block 210, the signature is compared to a library or database of known signatures of sounds that caused clipping in the past or are already known in block 214. The library can be built from known sounds, the library can be built as more signatures of signals are gathered, or the library can be a combination of provided signatures and signatures added as events are detected. For example, a signature for the sound of a movie slate can be provided in the library including an attack time of 2 milliseconds and a level of 70 dB. When a movie slate at 70 dB is detected the gain is reduced. Since the duration of a movie slate clacking is 0.4 seconds, the system knows to return the gain to the original level, or recheck the signal level, after 0.4 seconds. If the signature is not in the library or database, then the signature can be added or simply discarded. If the signature is in the database, then the line is monitored until the sound matching a known signature ends in block 216. The sound signature can be stored with characteristics to determine when a clipping event will likely occur and whether another event is likely to follow in succession. When a sound signature does not match one in the library, the system can monitor the signal level and restore the original gain once the level of the monitored line returns to normal. Alternatively, the reduced gain level can be maintained, if the user desires, making the gain reduction permanent until a crew member manually increases the gain. In other instances, the system maintains a reduced gain level after detecting that the gain was incorrectly set initially. The gain of the amplifier is reduced when sounds that are known to cause or suspected of causing clipping are present in the signal, thereby reducing signal distortion caused by amplifier saturation and clipping.

The gain level is returned to the initial level once the offending signal has passed to improve the signal levels compared to noise levels.

Figure 3B:
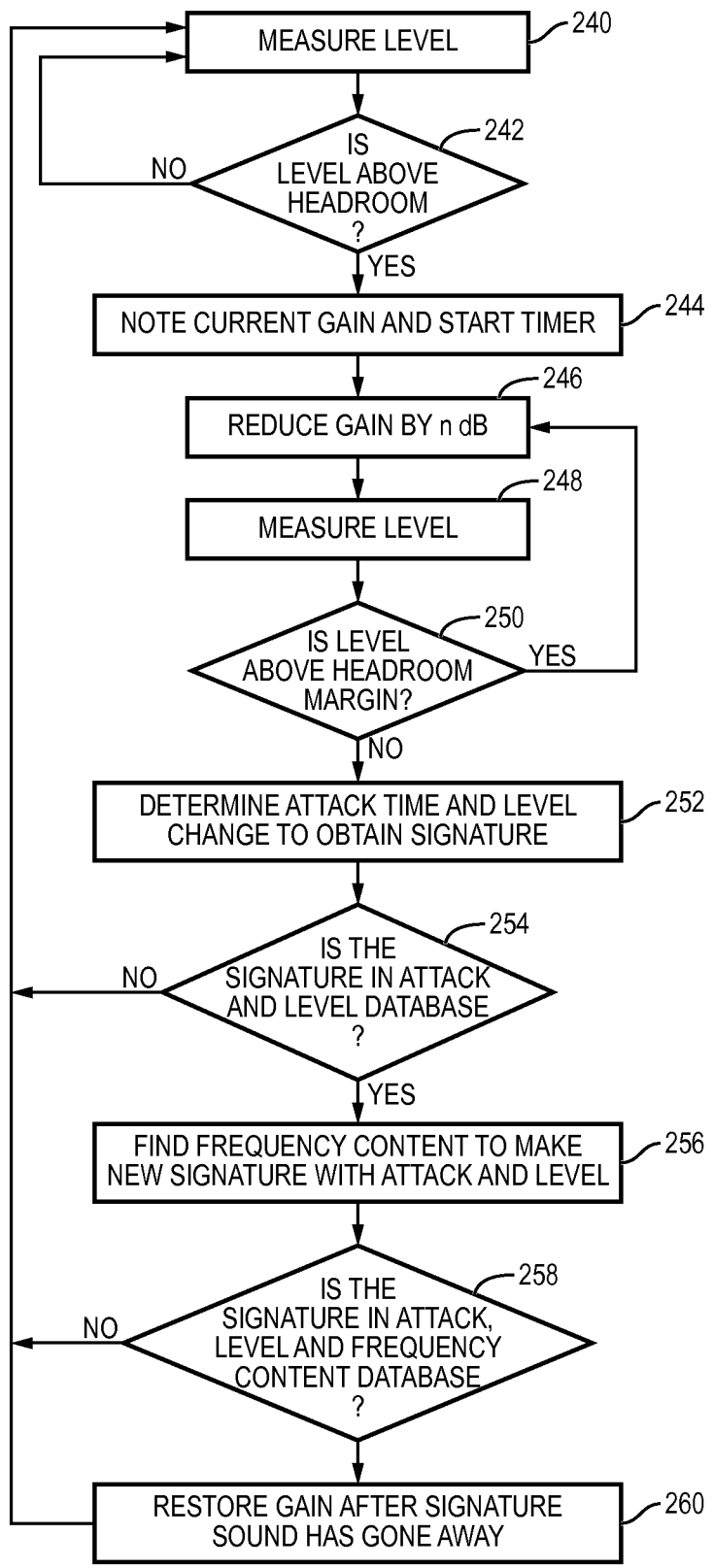

FIG. 3b illustrates a flowchart for an intelligent clip elimination system extending the functionality of the system from FIG. 3a. The clipping elimination system measures signal levels from an amplifier in block 240. The system determines whether the signal level is above a predetermined headroom in block 242. The headroom is determined by comparing the signal level from the amplifier to the maximum signal level for the amplifier. The difference between the maximum value for the amplifier and the current value measured at the input or output represents the headroom. The desired headroom can be preset on the clip elimination device, provided by a user, or variable based on fluctuations in output levels. For example, if the signal level at a certain time is 10 decibels (dB) and the maximum level for the amplifier, or the saturation threshold, is 25 dB then the amplifier has 15 dB of headroom. If the output headroom is set to 5 dB, and the amplifier has a maximum output of 50 dB, then any signal level above 45 dB exceeds the prescribed headroom. For example, the signal level is 50 dB with a prescribed headroom of 5 dB and the amplifier has a maximum signal level of 50 dB. The signal level exceeds the headroom by 5 dB and the gain level of the amplifier must be reduced to reduce the signal level below 45 dB and allow for 5 dB of headroom.

If the signal level does not exceed the prescribed headroom in block 242, then the system continues to measure the monitored signal level at block 240. If the signal level exceeds the maximum power of the amplifier less the headroom, the system reacts to the signal exceeding headroom as a potential clipping event. The current gain is saved for future use once the potential clipping event is detected, in block 244. A timer is also started in block 244. The timer tracks the duration of the clipping event in block 244. The time measurements from the timer can be saved in conjunction with the level measured in block 240 to calculate the attack, delay, sustain, or other time-based characteristics and formulate a time-based signature including the signal level. For example, a signal takes 2 seconds to reach peak amplitude of 70 dB. The level and attack signature would be identified by the 2 second attack and the ultimate level of 70 dB. The time can also be saved with frequency-based characteristics such as harmonics or timbre of a sound to produce a sound signature based on frequency characteristics over time. For example, a human scream might have a basic frequency of approximately 400 hertz (Hz) and resultant harmonics at 800 Hz, 1240 Hz, 1600 Hz, 2400 Hz, and so on. The level of the basic frequency and harmonics can be included to form a frequency-domain signature of the audio signal. The signal processor monitoring the line level can also monitor the frequency domain and identify sounds likely to cause clipping and reduce the gain before clipping occurs. In block 246, the system reduces the gain of the amplifier by a predetermined dB level. The gain reduction can be input by a user, preset for the device, or variable as an amount of gain to reduce the output level within the headroom.

After the gain is reduced, the system measures the level of the signal again in block 248. If the measurement is high enough that the reduced gain still exceeds the headroom, the gain is further reduced by a predetermined dB level in block 250. The signal level is measured and reduced until the level is within the desired headroom in blocks 246-250. When the measurement from block 248 is not above the desired headroom, the system determines the attack characteristics and levels, for example, to determine a signature of the sound causing the amplifier to clip at the original gain level in block 252. The system can also keep a window of past time domain signal waves to provide information regarding the attack of a sound prior to the levels reaching an amplitude sufficient to cause clipping at the original gain levels.

Once the system has determined a signature for the signal being monitored in block 250, the signature is compared to a library or database of known signatures of sounds that caused clipping in the past or are already known in block 254. The library can be built from known sounds, the library can be built as more signatures of signals are gathered, or the library can be a combination of provided signatures and signatures added as events are detected. For example, a signature for the sound of a movie slate can be provided in the library including an attack time of 2 milliseconds and a level of 70 dB. When a movie slate at 70 dB is detected the gain is reduced. Since the duration of a movie slate clacking is 0.4 seconds, the system knows to return the gain to the original level, or recheck the signal level, after 0.4 seconds. If the signature is not in the library or database, then the signature can be added to the library or simply discarded.

The system then converts the signal into the frequency domain and identifies a frequency domain signature in block 256. The system checks whether the signature including frequency domain information is in the database in block 258. If the signature is in the database then the line is monitored until the sound matching a known signature ends in block 260 and the original gain is restored. When a sound signature does not match a signature in the library, the system can monitor the signal level and restore the original gain once the level of the monitored line returns to a normal level. Alternatively, the reduced gain level can be maintained, if the user desires, making the gain reduction permanent until a crew member manually increases the gain. The gain of the amplifier is reduced when sounds that are known to cause clipping or have been detected as exceeding the desired headroom are detected, thereby reducing signal distortion caused by amplifier saturation and clipping. The gain level is returned to the initial level once the offending signal has passed to improve the signal levels compared to noise levels.

Figure 4:
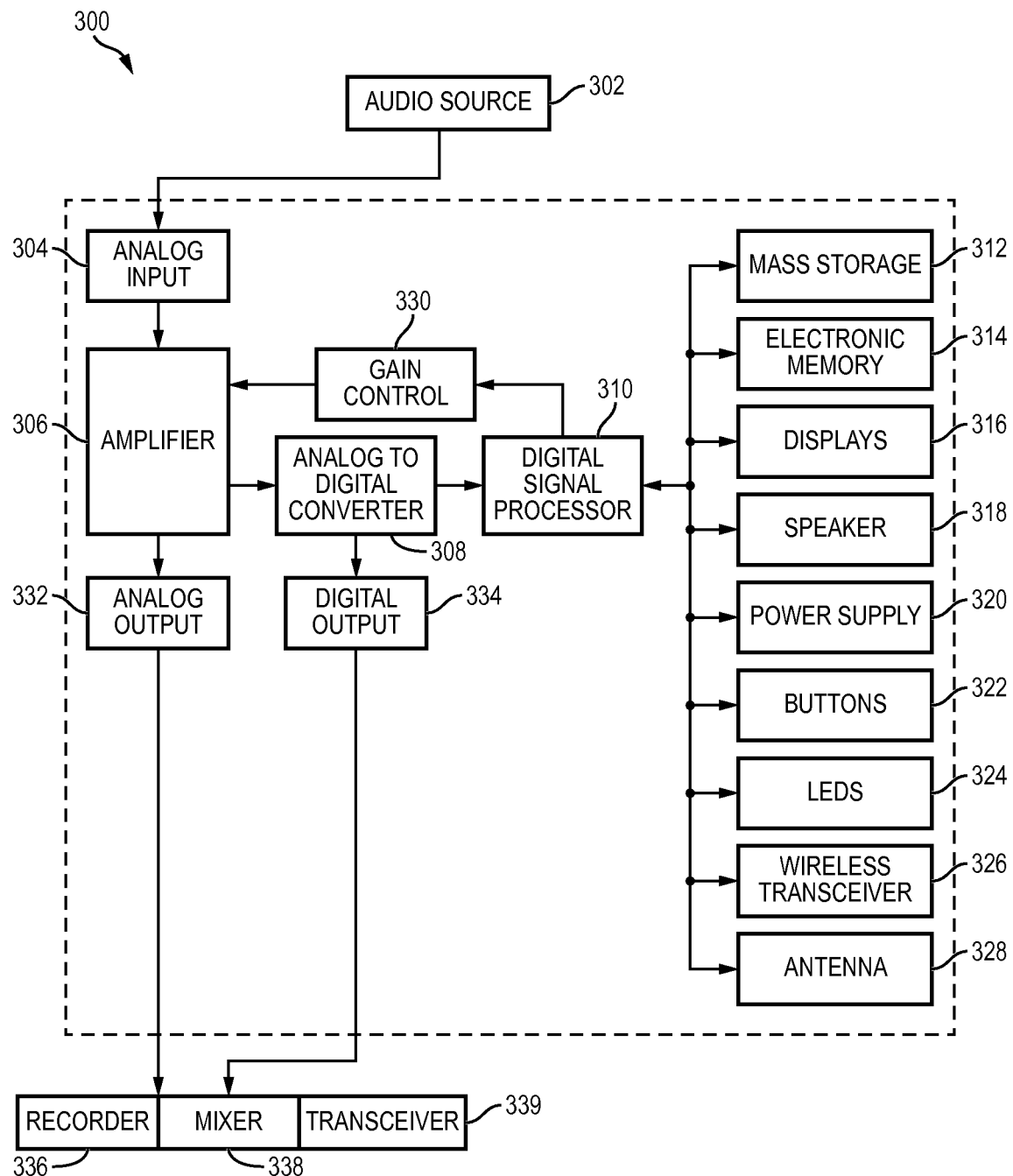
FIG. 4 illustrates a block diagram of a gain control device.

FIG. 4 illustrates a block diagram of the signal processing components of intelligent clipping elimination device. Audio source 302 can be a microphone, instrument, recording, or other electronic signal requiring amplification and is connected to analog input terminal 304. Alternatively, audio source 302 can be replaced by any analog signal that requires amplification where clipping is undesirable, such as video or electronic communication signals. Input terminal 304 connects the input to amplifier 306 so the analog signal can be amplified. Amplifier 306 sends the amplified signal to an analog-to-digital converter (A/D converter) 308 so that the signal can be processed in digital format. A/D converter 308 takes the analog input and converts the signal to a digital format at the desired sampling rate. The sampling rate can be selected by the user or predetermined and hardcoded into intelligent clip elimination device 300. The digital signal from A/D converter 308 is sent to digital signal processor (DSP) 310 where the signal is analyzed to determine whether the gain of amplifier 306 is set to the desired level.

DSP 310 is attached to mass storage 312, electronic memory, 314, displays 316, speaker 318, power supply 320, buttons 322, LEDs 324, wireless transceiver 326, and antenna 328. Mass storage 312 stores software to run DSP 310, drivers to interact with gain control 330 and control amplifier 306, and a library or database of signal signatures to identify known sounds that cause clipping. Electronic memory 314 holds temporary copies of software from mass storage 312 and digital signal data from A/D converter 308 during processing steps to improve access speed.

The components of intelligent clip elimination device 300 are contained within a housing, which can be molded plastic or metal, or other suitable material with sufficient strength and durability to protect the components of intelligent clip elimination device 300 from damage from the external environment. Intelligent clip elimination device 300 includes display 316, which is exposed on a surface of the housing. Display 316 can be any suitable display component capable of graphically displaying information for the benefit of a user, such as an LCD, LED display, plasma display, oLED display, or other suitable electronic visual display. Intelligent clip elimination device 300 further includes a plurality of interface buttons 322 for interacting with intelligent clip elimination device 300. For example, using interface buttons 322 and display 316, a user may select and modify settings of intelligent clip elimination device 300, such as the desired headroom for amplifier 306, the gain adjustment in dB when the headroom is exceeded, the sampling rate of A/D converter 308, the period before the gain is returned to the original value after the gain is reduced, or any other settings or preferences that the user needs to control.

Speaker 318 outputs audible signals for when clipping signals are detected, when a new sound signature is identified, when the gain is reduced or increased, and can reproduce the signal when the signal is audio information. Speaker 318 can be a headset, headphones, a speaker integrated into intelligent clip elimination device 300, or a stand-alone speaker. Output from speaker 318 can also be muted or disabled when audio signals are undesirable.

A power switch or button 322 is positioned externally on intelligent clip elimination device 300 to enable the user of intelligent clip elimination device 300 to power the device on and off. Power supply 232 is also electrically connected to intelligent clip elimination device 300, either externally or internally with respect to housing 270 as a power source for intelligent clip elimination device 300. For example, power supply 232 may be a removable or rechargeable battery, or an AC or DC electrical terminal mounted to a surface of intelligent clip elimination device 300 and capable of receiving and converting power from an external source.

Antenna 328 is mounted either externally or internally with respect to the housing, and enables wireless transceiver 326, shown in FIG. 4, to send and receive analog or digital audio signals, data signals, control signals, and other data to and from external devices. In particular, intelligent clip elimination device 300 receives audio signals from audio source 302 transmits audio signals by way of antenna 328 and wireless transceiver 326 to various mobile devices operated by members of the production crew or recorder 336, mixer 338, and transceiver 339. Wireless transceiver enables audio crew to adjust the intelligent clip elimination device or the amplifier remotely by providing input such as the desired headroom for amplifier 306, the gain adjustment in dB when the headroom is exceeded, the sampling rate of A/D converter 308, the period before the gain is returned to the original value after the gain is reduced, or the gain on the amplifier. DSP 310 enables staff to remotely adjust gain on wireless microphones in addition to enabling intelligent gain control.

The process of transmitting data stream 178 to the various mobile devices creates a delay in the audio signal, in particular when the audio is converted from analog to digital and back to analog. In some instances, intelligent clip elimination device is physically attached to an external device such as recorder 336 or mixer 338 through analog output 332 or digital output 334 using cables. The physical connection eliminates delay and any data loss associated with the wireless transmission and reception of the signal. In other instances, intelligent clip elimination device communicates with mixer 338 or recorder 336 using transceiver 339 to communicate wirelessly.

DSP 310 executes software to perform configuration and signal processing functions of intelligent clip eliminating device 300. DSP 310 evaluates the attack, sustain, and decay of the digital signal to identify signature features of the sound in the time domain. DSP 310 converts the digital signal from the time domain to the frequency domain to identify harmonics, timbre, and other frequency domain characteristics to identify a frequency domain signature. DSP 310 can evaluate characteristics of the time and frequency domains together or separately to identify known signals. DSP 310 reduces the gain of amplifier 306 using gain control 330 when the signature of a digital signal matches a sound known to cause clipping. DSP 310 also reduces the gain of amplifier 306 using gain control 330 when any signal, known or unknown by a signature, is exceeding the desired headroom on amplifier 306 or clipping. DSP 310 compares the output from amplifier 306 to the known maximum output of amplifier 306, or the desired maximum output of amplifier 306 to provide headroom, and determines whether the gain is causing clipping in amplifier 306 or exceeding the desired headroom for amplifier 306. The amplifier 306 produces an analog audio output that is digitally controlled using DSP 310. By using a digital control for the analog amplifier, the system produces an analog output that has not been converted into a digital format and back to analog for purposes of digital control.

Figure 5:
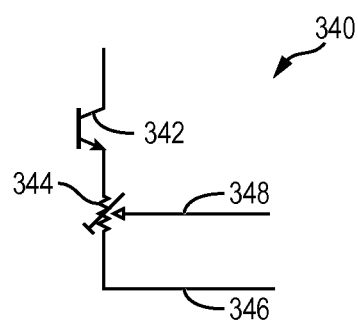
FIG. 5 illustrates a simple amplifier controlled by a digital signal processor.

FIG. 5 illustrates a simple amplifier 340 with an adjustable gain. Transistor 342 and variable resistor 344 form an amplification circuit. Output 346 of amplifier 340 connects to an A\D converter and a DSP. The DSP measures the level of output 346 to determine whether output 346 exceeds a predetermined headroom level of amplifier 340. DSP adjusts the gain of amplifier 340 by adjusting variable resistor 344 using output from DSP 348. Other variable load circuits can be controlled by DSP to adjust the gain of amplifier 340. Adjustable gain of amplifier 340 enables the device to adjust the gain when output levels exceed the headroom level. By reducing the gain when headroom levels are exceeded, clipping is avoided. The gain is increased automatically by DSP once the signal causing the clipping has returned to levels below the headroom. Alternatively, the system can detect that the gain was set at an incorrect level initially and maintain the reduced gain level.

Figure 6:
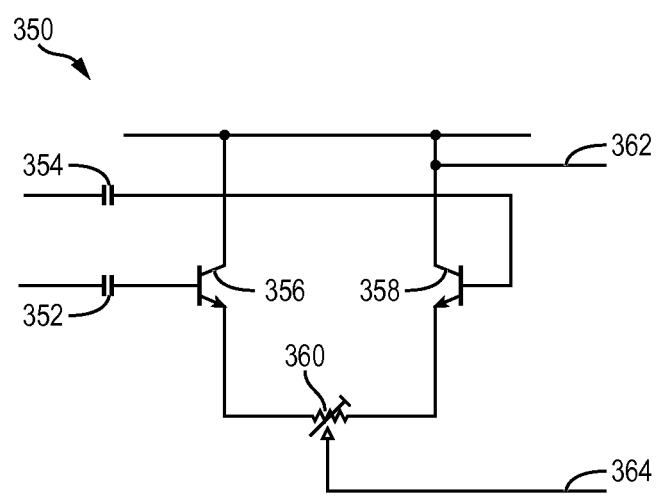
FIG. 6 illustrates a balanced amplifier controlled by a digital signal processor.

FIG. 6 illustrates a balanced amplifier 350 with an adjustable gain. Input lines include capacitors 352 and 354. Capacitor 352 is electrically connected to transistor 356 and capacitor 354 is electrically connected to transistor 358. The gain of amplifier 350 is adjustable by changing the resistance on variable resistor 360. Output 362 of amplifier 350 connects to an A\D converter and a DSP. The DSP measures the level of output 362 to determine whether output 362 exceeds a predetermined headroom level of amplifier 350. The DSP adjusts the gain of amplifier 350 by controlling variable resistor 360 using output 364 from DSP. Adjustable gain of amplifier 350 enables the device to adjust the gain when output levels exceed the headroom level. By reducing the gain when headroom levels are exceeded, clipping is avoided. The gain is increased automatically by DSP once the signal causing the clipping has returned to levels below the headroom. Alternatively, the system can detect that the gain was set at an incorrect level initially and maintain the reduced gain level.

Accordingly, intelligent clip elimination device 300 operates as an automatic gain controller, capable of analyzing a signal in digital format and controlling the gain of an amplifier to prevent clipping of an analog signal during amplification. Intelligent clip elimination device 300 further functions as a digital signal processor capable of performing analysis and modification of the digital signal to identify known audio signals. Intelligent clip elimination device 300 further enables remote adjustment and control of gain levels, headroom, and amplification settings by members of a production crew using a digital signal processor to control an analog amplifier. When intelligent clip elimination device 300 is deployed at the first amplification of an audio signal, from mic level to line level prior to transmission, for example, intelligent clip elimination device 300 can detect and prevent clipping by wireless microphone amplifiers before the signal reaches a recorder or mixer to improve the quality of the resulting amplified audio signal.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of monitoring an audio signal, comprising:
providing an amplifier including an adjustable gain set to a first gain level;
providing an analog input signal to the amplifier;
converting an analog output of the amplifier to a digital signal;
analyzing the digital signal to detect a level of the analog output exceeding a threshold;
setting the adjustable gain of the amplifier to a second gain level lower than the first gain level after the level of the analog output exceeds the threshold;
providing a library including a plurality of sound signatures, each sound signature including an associated duration stored in the library;
determining a first sound signature by analyzing the digital signal;
matching the first sound signature to a second sound signature stored in the library;
starting a timer;
reading the duration from the library;
comparing a value of the timer to the duration; and
returning the adjustable gain of the amplifier to the first gain level when the timer indicates that the duration associated with the second sound signature is exceeded.

2. The method of claim 1, further including providing an interface to adjust the threshold.

3. The method of claim 1, further including setting the adjustable gain to the first gain level and second gain level using a digital signal processor.

4. A method of monitoring an audio signal, comprising:
providing an amplifier including an adjustable gain;
providing an audio signal to an input of the amplifier;
determining a first sound signature for the audio signal after detecting a level of an output of the amplifier exceeding a threshold;
matching the first sound signature to a second sound signature stored in a library;
accessing a duration associated with the second sound signature in the library;
decreasing the adjustable gain;
starting a timer; and
increasing the adjustable gain of the amplifier after the timer indicates that the duration is exceeded.

5. The method of claim 4, further including monitoring a power level of an output of the amplifier to determine when to increase the adjustable gain of the amplifier.

6. The method of claim 4, further including setting the adjustable gain using a digital signal processor.

7. A method of monitoring an audio signal, comprising:
providing an amplifier including a gain level;
detecting a sound of an output of the amplifier that exceeds a threshold;
adjusting the gain level of the amplifier after detecting the sound;
reading a duration associated with a signature of the sound from a library;
starting a timer; and
resetting the gain level after the timer indicates that the duration associated with the sound is exceeded.

8. The method of claim 7, further including providing an interface to adjust the threshold.

9. The method of claim 7, further including monitoring the level of the output of the amplifier to determine when to reset the gain level.

10. The method of claim 7, further including adjusting the gain level using a digital signal processor.

11. A gain-control device, comprising:
an amplifier including a gain;
an analog-to-digital converter to convert an analog output of the amplifier to a digital output;
a database including a plurality of signatures, wherein each signature includes an associated duration stored in the database;
a timer; and
a digital signal processor coupled to detect a power level of the amplifier exceeding a threshold, wherein the digital signal processor is configured to reduce the gain of the amplifier, match a signature of the digital output to a signature stored in the database, and start the timer when the threshold is exceeded, and wherein the digital signal processor is configured to reset the gain of the amplifier after the timer indicates that the duration associated with the signature has elapsed.

12. The gain-control device of claim 11, further including an interface to adjust the threshold.

13. The gain-control device of claim 11, further including a wireless transceiver in communication with the digital signal processor to control the gain of the amplifier.

14. The method of claim 1, wherein determining the first sound signature further includes determining attack time and level change of a sound of the digital signal.

15. The method of claim 1, wherein the first sound signature includes a frequency-based characteristic.

16. The method of claim 4, wherein determining the first sound signature further includes determining attack time and level change of a sound of the audio signal.

17. The method of claim 4, further including increasing the adjustable gain of the amplifier after a level of an output of the amplifier is below the threshold.

18. The method of claim 7, further including storing the signature of the sound in the library after detecting the sound.

* * * * *